United States Patent
Kawaguchi et al.

(10) Patent No.: US 8,598,050 B2
(45) Date of Patent: Dec. 3, 2013

(54) LASER ANNEALING METHOD AND APPARATUS

(75) Inventors: Norihito Kawaguchi, Tokyo (JP);
Ryusuke Kawakami, Tokyo (JP);
Kenichiro Nishida, Tokyo (JP); Miyuki Masaki, Tokyo (JP); Masaru Morita, Tokyo (JP)

(73) Assignee: IHI Corporation, Tokyo (JP)

( * ) Notice: Subject to any disclaimer, the term of this patent is extended or adjusted under 35 U.S.C. 154(b) by 185 days.

(21) Appl. No.: 13/001,311

(22) PCT Filed: Jun. 19, 2009

(86) PCT No.: PCT/JP2009/061162
§ 371 (c)(1),
(2), (4) Date: Dec. 23, 2010

(87) PCT Pub. No.: WO2009/157373
PCT Pub. Date: Dec. 30, 2009

(65) Prior Publication Data
US 2011/0097907 A1    Apr. 28, 2011

(30) Foreign Application Priority Data
Jun. 26, 2008  (JP) .................................. 2008-166747

(51) Int. Cl.
*H01L 21/00* (2006.01)

(52) U.S. Cl.
USPC ........... 438/795; 438/150; 438/487; 438/151; 438/535; 438/164; 257/64; 257/66; 257/75; 257/499

(58) Field of Classification Search
USPC ................ 438/795, 150, 487, 151, 535, 164; 257/66, 64, 75, 499
See application file for complete search history.

(56) References Cited

U.S. PATENT DOCUMENTS

| | | | | |
|---|---|---|---|---|
| 5,970,368 | A | * | 10/1999 | Sasaki et al. ................... 438/487 |
| 6,071,765 | A | * | 6/2000 | Noguchi et al. .............. 438/166 |
| 6,733,931 | B2 | * | 5/2004 | Voutsas et al. .................... 430/5 |

(Continued)

FOREIGN PATENT DOCUMENTS

| JP | 11016834 A | 1/1999 |
|---|---|---|
| JP | 200084686 A | 3/2000 |

(Continued)

OTHER PUBLICATIONS

Extended European Search Report issued in EP Application No. 09770083.5, completed Jun. 30, 2011 and mailed on Jul. 6, 2011.

(Continued)

*Primary Examiner* — Fernando L Toledo
*Assistant Examiner* — Mohammed Shamsuzzaman
(74) *Attorney, Agent, or Firm* — Griffin & Szipl, P.C.

(57) ABSTRACT

Disclosed are a laser annealing method and apparatus capable of forming a crystalline semiconductor thin film on the entire surface of a substrate without sacrificing the uniformity of crystallinity in a seam portion in a long-axis direction of laser light, the crystalline semiconductor thin film having good properties and high uniformity to an extent that the seam portion is not visually recognizable. During the irradiation of a linear beam, portions corresponding to the edges of the linear beam are shielded by a mask 10 which is disposed on the optical path of a laser light 2, and the mask 10 is operated so that the amount of shielding is periodically increased and decreased.

9 Claims, 4 Drawing Sheets

(56) References Cited

U.S. PATENT DOCUMENTS

| | | | |
|---|---|---|---|
| 6,806,498 B2 * | 10/2004 | Taketomi et al. | 257/64 |
| 6,818,568 B2 * | 11/2004 | Tanaka | 438/795 |
| 7,078,322 B2 * | 7/2006 | Tanada et al. | 438/487 |
| 7,105,048 B2 * | 9/2006 | Yamazaki et al. | 117/3 |
| 7,304,005 B2 * | 12/2007 | Yamazaki et al. | 438/795 |
| 7,326,295 B2 * | 2/2008 | Park et al. | 117/95 |
| 7,560,397 B2 * | 7/2009 | Yamazaki et al. | 438/795 |
| 7,585,714 B2 * | 9/2009 | Yamazaki et al. | 438/164 |
| 7,714,251 B2 * | 5/2010 | Miyairi | 219/121.83 |
| 7,723,167 B2 * | 5/2010 | Tanaka | 438/164 |
| 8,153,928 B2 | 4/2012 | Aubert et al. | |
| 8,198,567 B2 | 6/2012 | Lerner et al. | |
| 2002/0096680 A1 * | 7/2002 | Sugano et al. | 257/66 |
| 2003/0022471 A1 * | 1/2003 | Taketomi et al. | 438/496 |
| 2003/0112322 A1 * | 6/2003 | Tanaka | 347/241 |
| 2003/0175599 A1 * | 9/2003 | Voutsas et al. | 430/5 |
| 2004/0053450 A1 * | 3/2004 | Sposili et al. | 438/151 |
| 2005/0118751 A1 * | 6/2005 | Yamazaki et al. | 438/149 |
| 2005/0181550 A1 * | 8/2005 | Tanaka | 438/150 |
| 2007/0000428 A1 * | 1/2007 | Yamazaki et al. | 117/3 |
| 2007/0008534 A1 * | 1/2007 | Lo et al. | 356/401 |
| 2007/0010104 A1 * | 1/2007 | Im et al. | 438/795 |
| 2007/0054478 A1 | 3/2007 | Tsao | |
| 2007/0148925 A1 * | 6/2007 | Yamazaki et al. | 438/487 |
| 2007/0184641 A1 * | 8/2007 | Tanaka | 438/535 |
| 2008/0118203 A1 * | 5/2008 | Tanaka | 385/31 |
| 2008/0204197 A1 * | 8/2008 | Shionoiri | 340/10.1 |
| 2008/0251877 A1 * | 10/2008 | Jain et al. | 257/499 |
| 2009/0045181 A1 * | 2/2009 | Im | 219/121.76 |
| 2009/0191694 A1 * | 7/2009 | Tanaka | 438/480 |
| 2009/0203230 A1 * | 8/2009 | Park | 438/795 |
| 2009/0218577 A1 * | 9/2009 | Im | 257/75 |
| 2009/0305483 A1 * | 12/2009 | Tanaka | 438/458 |
| 2010/0323504 A1 * | 12/2010 | Tanaka et al. | 438/487 |
| 2011/0003484 A1 * | 1/2011 | Kim et al. | 438/795 |
| 2011/0097906 A1 * | 4/2011 | Kwon et al. | 438/795 |
| 2011/0104908 A1 * | 5/2011 | You | 438/795 |
| 2011/0186854 A1 * | 8/2011 | Im | 257/72 |

FOREIGN PATENT DOCUMENTS

| | | |
|---|---|---|
| JP | 2000-315652 | 11/2000 |
| JP | 2003142395 A | 5/2003 |
| JP | 2005-243747 | 9/2005 |
| JP | 2006093677 A | 4/2006 |
| KR | 10-2004-0031276 | 4/2004 |
| KR | 2004031276 | 4/2004 |
| KR | 20070071082 A | 7/2007 |
| TW | 200507094 A | 2/2005 |
| TW | 200824829 A | 6/2008 |
| WO | 2006/022196 A1 | 3/2006 |

OTHER PUBLICATIONS

International Search Report issued in corresponding Japanese Application No. PCT/JP2009/061162, completed Jul. 15, 2009, mailed Jul. 28, 2009.

Notice of Allowance issued on Jun. 26, 2013 in related U.S. Appl. No. 13/002,010.

Office Action issued in co-pending related U.S. Appl. No. 13/002,010 on Jan. 22, 2013.

"Peltier—Thermoelectric Cooler Modules," at http://www.tetech.com/Peltier-Thermoelectric-Cooler-Modules.html (2010).

"Aligner—definition of aligner by the Free Online Dictionary," at http://www.thefreedictionary.com/p/aligner (2013).

Espacenet—Bibliographic data corresponding to KR20040031276 (A), last updated Dec. 19, 2012, which corresponds to Exhibit B filed in a related application.

Espacenet—Bibliographic data corresponding to JP 11-176730 (A), downloaded Dec. 29, 2010, which corresponds to Exhibit C filed in a related application.

Office Action issued on Nov. 21, 2011 in related Taiwanese Patent Application No. 98120374.

Office Action issued on Nov. 22, 2011 in related Korean Patent Application No. 10-2010-702718.

* cited by examiner

SHIELD POSITION

LASER ANNEALING METHOD AND APPARATUS

This is a National Phase Application in the United States of International Patent Application No. PCT/JP2009/061162 filed Jun. 19, 2009, which claims priority on Japanese Patent Application No. 2008/166747, filed Jun. 26, 2008. The entire disclosures of the above patent applications are hereby incorporated by reference.

BACKGROUND OF THE INVENTION

1. Technical Field of the Invention

The present invention relates to a laser annealing method and apparatus for performing an annealing treatment on a workpiece to be processed by irradiating the workpiece with laser light.

2. Description of the Related Art

Hitherto, in order to realize a high-performance device such as a liquid crystal display, a method of forming a high-performance semiconductor device such as a thin film transistor on an insulating substrate such as a glass substrate has been developed. In this semiconductor device, thin-film polycrystalline silicon obtained by crystallizing amorphous silicon by a heat treatment is generally used.

As a method of manufacturing a polycrystalline silicon film, a method of forming an amorphous silicon film in advance on a substrate and crystallizing the film by irradiation of laser light is generally used. According to this method, since it utilizes a crystallization phenomenon in the process of melting and solidification of the semiconductor thin film, it is possible to obtain a high-quality polycrystalline silicon film having a relatively large particle size.

As the laser annealing method that is most commonly used at present, a method that uses pulsed laser light, particularly, an excimer laser is known. In recent years, methods that use a YAG laser or a YLF laser which is a solid-state laser have been developed. The method that uses pulsed laser light involves locally melting an amorphous silicon film and heating the melted area to a high temperature for only a very short period. For this reason, since the high temperature is not transmitted to the substrate, it is possible to use a low-cost glass substrate rather than using an expensive quartz substrate having excellent heat resistance. Thus, such a method is most suitable for low-temperature processes of a large-area electronic device.

In a general laser annealing method, when an excimer laser is used, for example, laser light is shaped by an optical system into a linear beam of which the long-side beam length is 465 mm and the short-side beam length is 0.4 to 5 mm. In the case of a YAG laser, it is possible to obtain a linear beam of which the long-side beam length is 200 mm and the short-side beam length is 40 to 50 μm. The laser light and the substrate are moved relative to each other so that the irradiation position of the linear beam partially overlaps with the irradiation area in the short-side direction of the beam, whereby crystallization of the semiconductor film is realized. In general, the overlap ratio is set to about 95%, and the same area is irradiated with about 20 shots of laser beams.

FIGS. 1A and 1B are diagrams illustrating a conventional laser annealing method. FIG. 1A shows a state in which a substrate 30 is irradiated with laser light 31 while moving the laser light 31 in the short-side direction of the beam relative to a substrate 30. When the substrate 30 of which the size is longer than the beam length is processed, first, a first row R1 is irradiated as shown in FIG. 1A. When irradiation of the first row R1 is completed, the laser light 31 is relatively moved in the long-axis direction so as to perform irradiation of second and subsequent rows. FIG. 1B shows an example in which the entire surface of the substrate is processed by irradiation of two rows. At that time, a seam portion W of the beam is formed between adjacent rows (in FIG. 1B, the first row R1 and the second row R2).

In general laser annealing, the edges of the linear beams of adjacent rows are irradiated in an overlapping manner, whereby the seam portion W is formed.

In this seam portion W, the overlap (overlapped irradiation of beams) is excessive, and a crystallization quality thereof is different from that of the other areas, whereby the seam portion W is visible to the naked eye. On the other hand, when there is a small or no overlap of the beams of adjacent rows, the overlap becomes insufficient at the edges of the beams. Thus, an amorphous portion remains, and as was expected, the crystallinity thereof is different from that of the other areas.

Since the beam seam portion W is an area which is irradiated with both the beams of the adjacent rows (for example, the first row R1 and the second row R2), the crystallinity of that area is different from that of the other areas. The crystallinity fluctuates greatly in the case of the excimer laser, and although the fluctuation becomes small with a second harmonic wave of a YAG laser compared to the excimer laser, the crystallinity fluctuates as was expected.

When a thin film transistor is manufactured using an area in which the crystallinity is not uniform, it is not possible to obtain a uniform performance of the thin film transistor. In a display apparatus such as a liquid crystal display or an organic EL display, the display quality thereof is likely to depend on the uniformity of the performance of the thin film transistor. Therefore, in order to maintain the display quality, a display panel has to be manufactured within an area that is limited to the beam length of laser light. In the case of a green YAG laser, since the beam length thereof is short, it is difficult to manufacture a large-size display whose size exceeds 20 inches.

Techniques for preventing the non-uniformity of the crystallinity in the beam seam portion W as described above are disclosed in Patent Documents 1 and 2, for example.

The method of Patent Document 1 is to make the crystallinities uniform between the overlapping portion and the non-overlapping portion of the laser light by regulating the width dimension and the energy density of laser light when the irradiation areas of laser light are made to overlap each other so as to crystallize a large-area semiconductor thin film.

The method of Patent Document 2 is to make the crystallinity uniform by setting the beam profiles in a seam portion so that the slope portions of the beam profiles overlap each other in an area where the laser intensity is 20% or higher and 80% or lower.

[Patent Document 1] Japanese Unexamined Patent Application Publication No. 2000-315652

[Patent Document 2] Japanese Unexamined Patent Application Publication No. 2005-243747

However, the method of Patent Document 1 has a problem in that it is not easy to regulate the width dimension and the energy density of the laser light, and productivity of the device decreases.

In the method of Patent Document 2, since the beams overlap each other under the conditions of different energy densities, it is expected that the crystallinity becomes nonuniform in the case of the excimer laser with which the crystallinity fluctuates particularly greatly with variations in energy.

SUMMARY OF THE INVENTION

The present invention has been made in consideration of the above-mentioned problems, and an object of the present invention is to provide a laser annealing method and apparatus capable of forming a crystalline semiconductor thin film on the entire surface of a substrate when the semiconductor thin film formed on the substrate such as a glass is crystallized by laser irradiation, without sacrificing the uniformity of crystallinity in a seam portion in a long-axis direction of laser light, the crystalline semiconductor thin film having good properties and high uniformity to an extent that the seam portion is not visually recognizable.

To achieve the above object, the laser annealing method and apparatus of the present invention employ the following means.

(1) The present invention provides a laser annealing method of performing an annealing treatment on a workpiece to be processed by irradiating the workpiece with a linear beam obtained by shaping laser light into a linear shape while moving the linear beam in a short-side direction relative to the workpiece, characterized in that: irradiation of the linear beam with the relative movement in the short-side direction is performed on two or more rows while shifting in a long-axis direction of the beam so that beam irradiation areas of adjacent rows partially overlap each other; and during the irradiation of the linear beam, portions corresponding to edges of the linear beam are shielded by a mask which is disposed on an optical path of the laser light, and the mask is operated so as to periodically increase and decrease the amount of shielding.

(2) In the laser annealing method as set forth in (1), the amount of shielding is periodically increased and decreased by oscillating the mask.

(3) In the laser annealing method as set forth in (2), the mask is oscillated using a piezoelectric element.

(4) The present invention further provides a laser annealing apparatus that performs an annealing treatment on a workpiece by irradiating the workpiece with a linear beam obtained by shaping laser light into a linear shape while moving the linear beam in a short-side direction relative to the workpiece, characterized in that the apparatus comprises: a mask that is disposed on an optical path of the laser light so as to shield portions corresponding to edges of the linear beam; and a mask drive unit that operates the mask so as to periodically increase and decrease the amount of shielding by the mask.

(5) In the laser annealing apparatus as set forth in (4), the mask drive unit periodically increases and decreases the amount of shielding by oscillating the mask.

(6) In the laser annealing apparatus as set forth in (5), the mask drive unit is a piezoelectric element.

According to the method as set forth in (1) and the apparatus as set forth in (3), since portions corresponding to the edges of the linear beam are shielded by the mask, and the mask is operated so as to periodically Increase and decrease the amount of shielding, the overlap ratio at the shielded beam edge portion is lower than that at the non-shielded portion. In this way, it is possible to suppress an excess of the overlap at the seam portion and prevent a deficit of the overlap by irradiating the beams so as to overlap each other at adjacent rows. Therefore, it is possible to reduce non-uniformity of the crystallinity at the seam portion and form the semiconductor thin film having high uniformity on the entire surface of the substrate.

According to the method as set forth in (2) and the apparatus as set forth in (4), it is possible to easily control the overlap ratio by oscillating the mask.

According to the method as set forth in (3) and the apparatus as set forth in (6), since the piezoelectric element is able to generate a high-frequency oscillation by controlling an application voltage, it is possible to easily realize a fast oscillation of the mask and easily control the overlap ratio.

DESCRIPTION OF THE PREFERRED EMBODIMENT

Figure 1A:
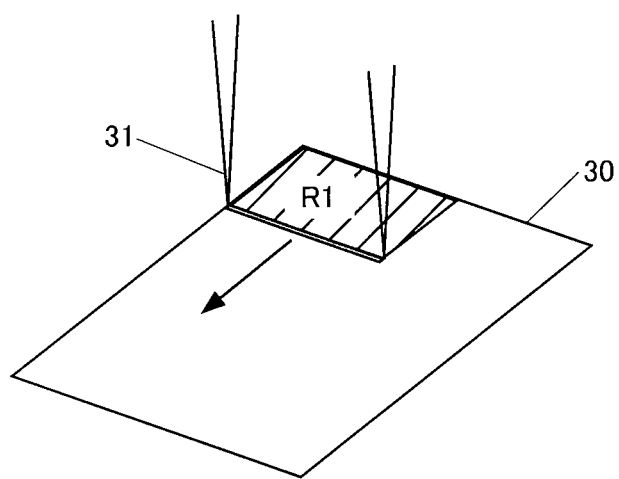
FIG. 1A is a diagram illustrating irradiation of a first row according to a conventional laser annealing method.
Figure 1B:
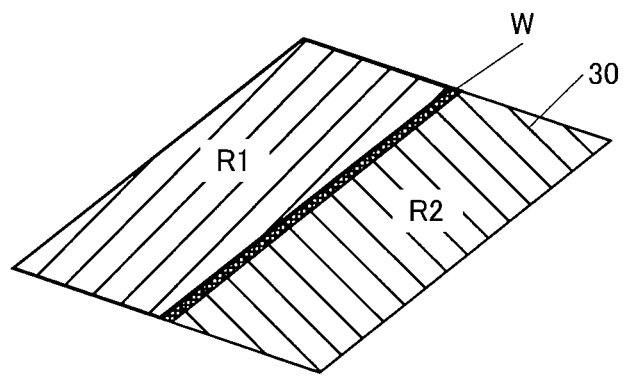
FIG. 1B is a diagram illustrating a state in which the entire surface of a substrate is processed according to the conventional laser annealing method.

Preferred embodiments of the present invention will be described below in detail with reference to the accompanying drawings. Same reference numerals are given to common portions in each of the drawings to avoid redundant description.

Figure 2:
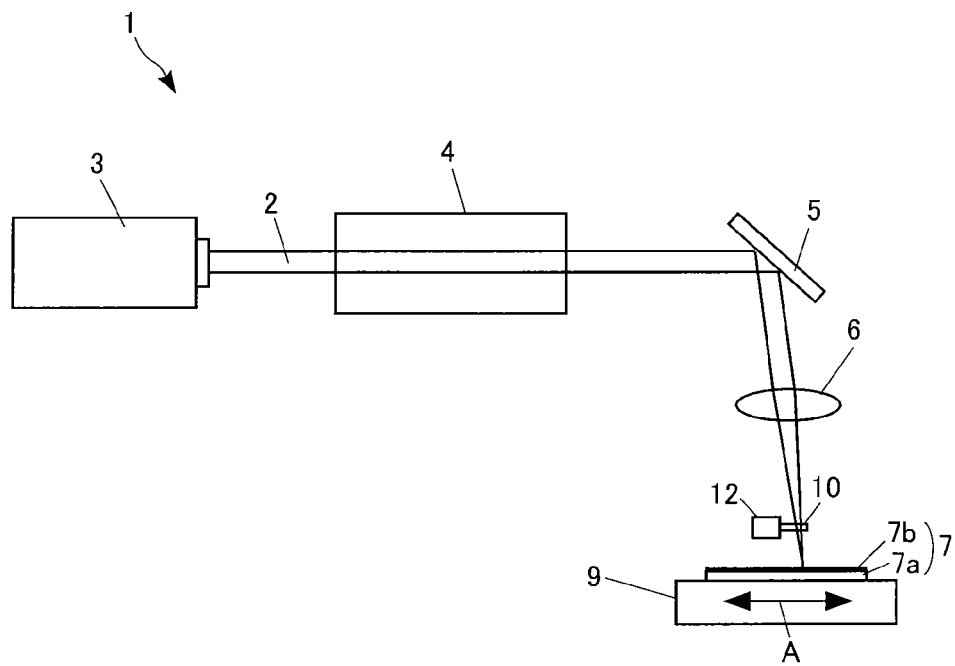
FIG. 2 is a diagram showing an entire configuration of a laser annealing apparatus according to an embodiment of the present invention.

FIG. 2 is a diagram showing an entire configuration of a laser annealing apparatus 1 according to an embodiment of the present invention.

The laser annealing apparatus 1 includes, as its basic constituent elements, a laser light source 3 that emits laser light 2, a beam shaping optical system 4 that shapes the laser light 2 from the laser light source 3, a reflecting mirror 5 that reflects the laser light 2 towards a workpiece 7, a condensing lens 6 that condenses the laser light 2 from the reflecting mirror 5 onto the surface of the workpiece 7, and a movable stage 9 that moves while carrying the workpiece 7.

As the laser light source 3, an excimer laser, a solid-state laser, or a semiconductor laser can be used, for example. As examples of the solid-state laser, YAG, YLF, YVO$_4$, and the like can be used. The laser light 2 may be either pulse oscillated or continuously oscillated.

The beam shaping optical system 4 is configured to shape the laser light 2 so as to form a linear beam on the surface of the workpiece 7, and can include a beam expander, a homogenizer, and the like as its constituent elements.

The workpiece 7 includes a substrate 7a and an amorphous semiconductor film 7b formed thereon. The substrate 7a is a glass substrate or a semiconductor substrate. The amorphous semiconductor film 7b is an amorphous silicon film, for example.

The movable stage 9 is configured to be movable in the direction indicated by arrow A in the figure. Therefore, by moving the workpiece 7 in the short-side direction (A direction) of the linear beam using the movable stage 9 while irradiating the laser light 2, it is possible to move the irradiation portion of the laser light 1 in the short-side direction relative to the workpiece 7. Moreover, the movable stage 9 is configured to be movable in a direction perpendicular to the sheet plane of FIG. 2, which is the same direction as the long-axis direction of the linear beam.

The laser annealing apparatus 1 of the present invention further includes a mask 10 that is disposed on the optical path of the laser light 2 so as to shield portions corresponding to the edges of the linear beam and a mask drive unit 12 that operates the mask 10 so that the amount of shielding by the mask 10 is periodically increased and decreased.

Figure 3A:
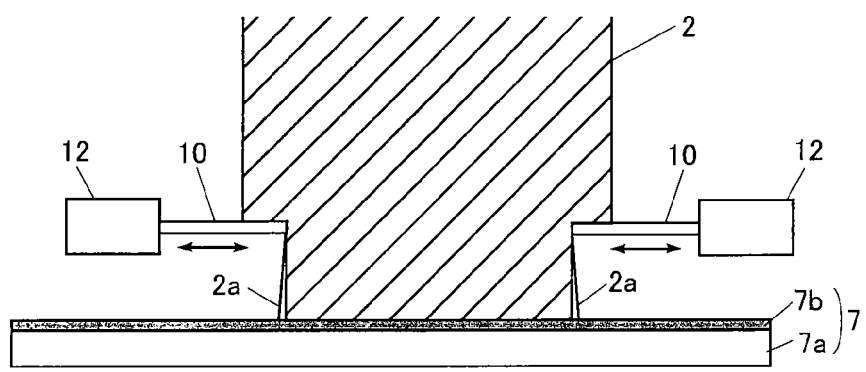
FIG. 3A is a diagram showing a mask and one configuration example of a mask drive unit.
Figure 3B:
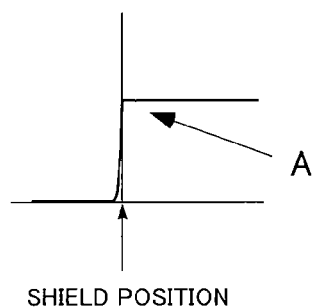
FIG. 3B is a diagram showing energy distribution in the long-axis direction of a beam edge.

FIG. 3A is a diagram showing the mask 10 and one configuration example of the mask drive unit 12, and the left-right direction of the figure corresponds to the long-axis direction of the beam of the laser light 2. In this example, the mask 10 is disposed at a position right above the substrate and shields the laser light 2 at this position. Moreover, in this example, the mask 10 is disposed at both edges in the long-axis direction of the laser light 2. FIG. 3B shows the energy distribution in the long-axis direction of a beam edge (only the left edge in the figure). When the light is shielded by the mask 10 in this manner, a gradient portion resulting from a diffracted light $2a$ is formed at the position of the energy distribution A corresponding to the beam edge.

The mask 10 can be formed by subjecting a metal plate or a glass plate, for example, to metal plating and can be formed of monocrystalline silicon.

The mask drive unit 12 may be configured to periodically increase and decrease the amount of shielding by oscillating the mask 10. In the configuration example of FIG. 3, the mask drive unit 12 oscillates the mask 10 in the long-axis direction of the beam. By oscillating the mask 10, it is possible to easily control an overlap ratio described later.

The mask drive unit 12 that oscillates the mask 10 can be configured by a piezoelectric element. Since the piezoelectric element can generate a high-frequency oscillation through control of an application voltage, it is possible to easily realize a fast oscillation of the mask 10. Moreover, the mask drive unit 12 may be configured by a motor and a mechanism that converts a rotational movement of the motor into a reciprocating movement.

The operation mode of the mask 10 may include a rotation as well as an oscillation. For example, the same effects can be obtained when the mask 10 is configured as a rotating plate with a cutout corresponding to the oscillation width of the mask (the rotating plate may be made of metal or ceramics or may be a glass plate coated with a shielding film such as a chrome film). For example, when an overlap ratio is set to 95% using a pulsed laser of which the pulse frequency is 2 kHz (for example, a case where irradiation is performed at a transfer speed of 5 μm/pulse with a beam width of 100 μm: the same area is irradiated with 20 shots of laser beams), if the rotation frequency of the rotating plate is synchronized at 2 kHz so that the laser beam passes through the cutout, the overlap ratio will remain at 95%. On the other hand, when the rotation frequency of the rotating plate is set to 1 kHz, since the laser beam is shielded once every two rotations by the rotating plate, the beam edge is irradiated with 10 shots among the 20 shots. Thus, since the apparent transfer speed per pulse is doubled, the overlap ratio is decreased to 90%. Further, by decreasing the synchronization rotation frequency, the overlap ratio can be decreased further.

The overlap ratio OR is defined by the following formula.

$OR=(1-V/W)\times 100$ (where $W$ is a beam width and $V$ is a transfer speed (per pulse))

Figure 4:
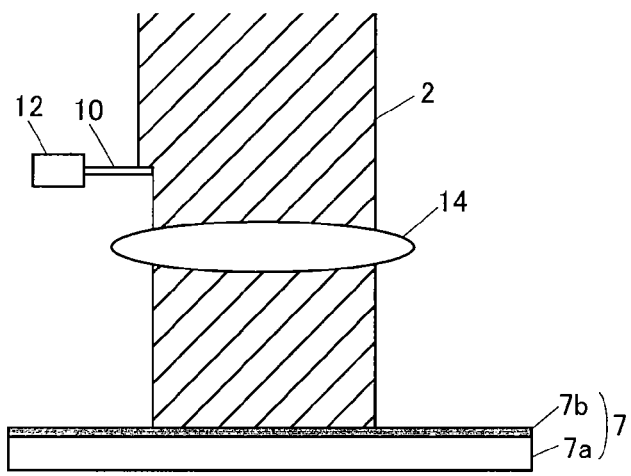
FIG. 4 is a diagram showing another arrangement example of the mask.

Moreover, as another example of the arrangement position of the mask 10, as shown in FIG. 4, a configuration in which the edges of a temporarily formed image are shielded by the mask 10, and the image is imaged on an irradiation surface by an optical system 14 may be possible. In this case, the mask 10 may be disposed at both edges in the long-axis direction of the laser light 2 similarly to FIG. 3.

Figure 5:
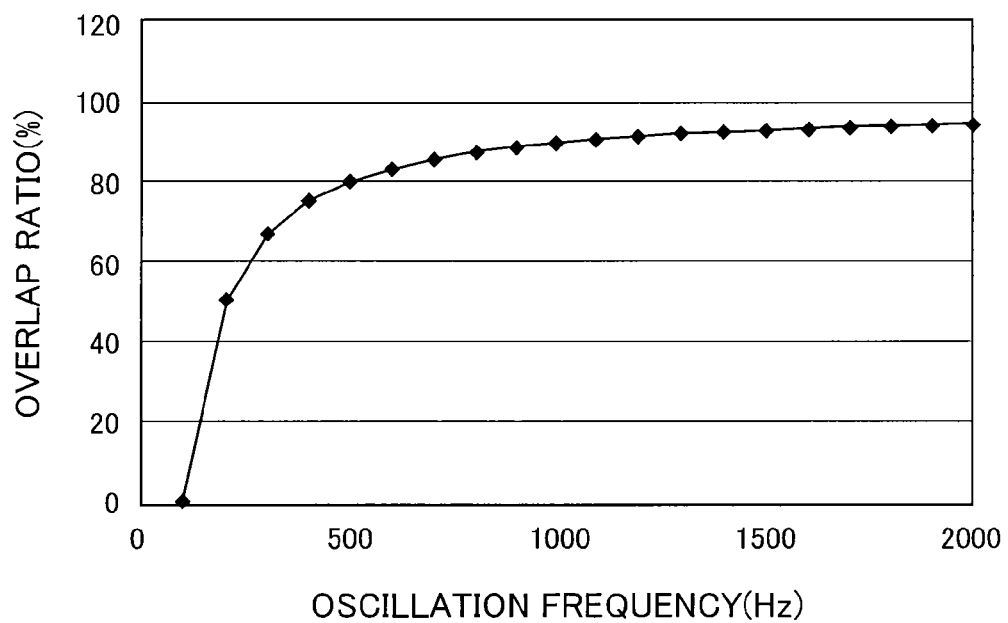
FIG. 5 is a diagram showing the relationship between an oscillation frequency of the mask and an overlap ratio of the beam edge.

FIG. 5 shows changes in the overlap ratio of a laser beam irradiated to a beam edge by the oscillation frequency of the mask 10 when the overlap ratio is set to 95% using a pulse laser of which the pulse frequency is 2 kHz (for example, a case where irradiation is performed at a transfer speed of 5 μm/pulse with a beam width of 100 μm: the same area is irradiated with 20 shots of laser beams).

When the oscillation frequency is set to 1 kHz, since the beam edge is irradiated with only 10 shots of laser beams, the apparent transfer speed per pulse is doubled, and the overlap ratio is changed from 95% to 90%. When the oscillation frequency is changed to 500 Hz, since as is clear from FIG. 5, the beam edge will be irradiated with only 5 shots of laser beams, the overlap ratio can be reduced to 80%.

Given the above, by controlling the oscillation frequency so as to be lower, it is possible to decrease the overlap ratio at the beam edge.

The overlap ratio OR is defined by the following formula.

$OR=(1-V/W)\times 100$ (where $W$ is a beam width and $V$ is a transfer speed (per pulse))

Next, a description of the operation of the laser annealing apparatus 1 configured as above will be provided.

In FIG. 2, the laser light 2 is emitted from the laser light source 3, and the laser light 2 is condensed into a linear beam by the beam shaping by the beam shaping optical system 4 and the condensing by the condensing lens 6 and irradiated onto the workpiece 7.

Figure 6A:
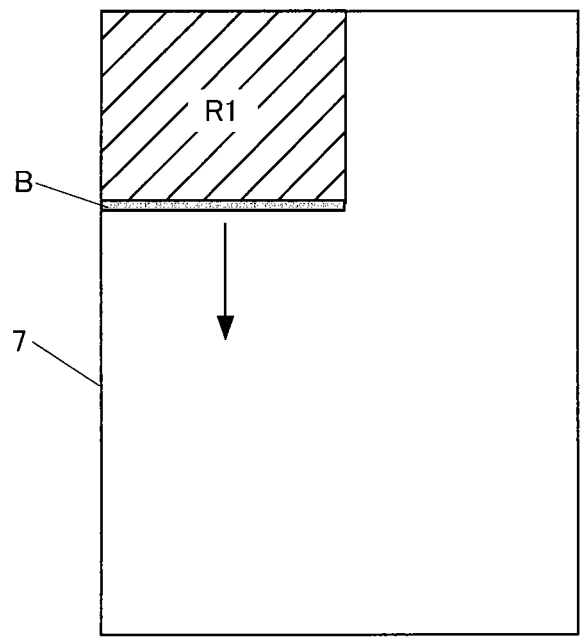
FIG. 6A is a diagram illustrating irradiation of a first row by a laser annealing apparatus of the present invention.

In this state, as shown in FIG. 6A, the linear beam (an irradiation portion B thereof) is moved in the short-side direction relative to the workpiece 7 by the movement of the movable stage 9, whereby an amorphous semiconductor film is crystallized at the laser irradiation portion B. For example, the amorphous silicon film is changed to a polysilicon film.

Figure 6B:
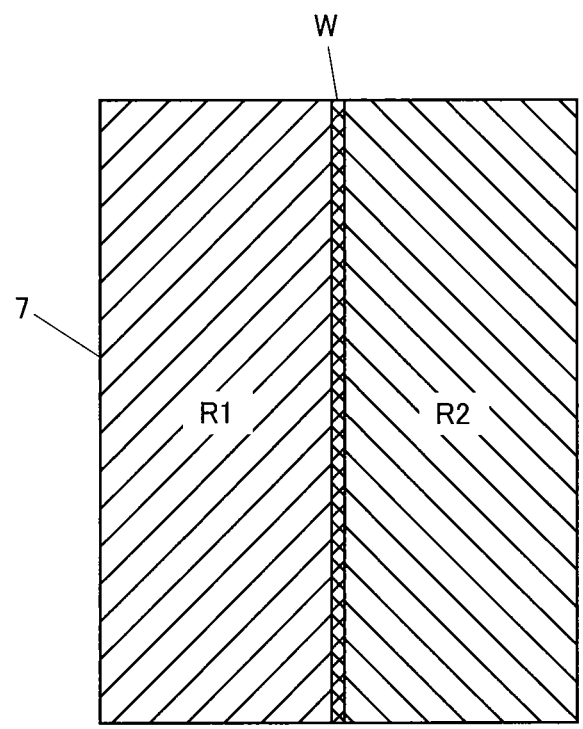
FIG. 6B is a diagram illustrating a state in which the entire surface of a substrate is processed by the laser annealing apparatus of the present invention.

When a substrate of which the size is longer than the length in the long-axis direction of the linear beam is processed, after irradiation of the first row is completed, the laser light 2 is moved relatively in the long-axis direction by the movement of the movable stage so as to perform irradiation of the second and subsequent rows. At that time, the irradiation is performed so that the beam irradiation areas of the adjacent rows overlap each other. In this way, the entire surface of the substrate is irradiated. FIG. 6B shows an example in which the workpiece 7 is processed by irradiation of two rows, and R1 is the first row and R2 is the second row. Moreover, W is an overlap portion (seam portion) of the first and second rows.

In the present invention, during the irradiation of the linear beam, portions corresponding to the edges of the linear beam are shielded by the mask 10 which is disposed on the optical path of the laser light 2, and the mask 10 is operated so as to periodically increase and decrease the amount of shielding, thus decreasing the overlap ratio. In the case where the overlap ratio is not controlled as in the conventional technique, the seam portion W is irradiated with shots of laser beams corresponding to two rows. However, by decreasing the overlap ratio at the beam edges as in the present invention, it is possible to decrease the amount of irradiation at the seam portion W, and accordingly, to prevent an excess of the overlap ratio.

Moreover, by irradiating the adjacent rows with overlapping laser beams, it is possible to prevent a deficit of the overlap.

Here, the control of the overlap ratio at the beam edges by the mask 10 may be performed on a beam edge at the side corresponding to the seam portion W when at least one of the adjacent two rows is irradiated. For example, the first row may be irradiated without being shielded by the mask 10, and the overlap ratio at the beam edge may be controlled during the irradiation of the second row. Conversely, the overlap ratio at the beam edge may be controlled during the irradiation of the first row R1, and the second row may be irradiated without being shielded by the mask 10. In this case, since the control of the overlap ratio at the beam edge can be performed on only one edge, it is only necessary to dispose the mask 10 at only one side of the laser light 2.

Alternatively, the control of the overlap ratio at the beam edges on the side corresponding to the seam portion W may be performed when both of the adjacent two rows are irradiated.

In this case, since the control of the overlap ratio at the beam edges needs to be performed on both edges, it is necessary to dispose the mask 10 on both sides in the long-axis direction of the laser light 2 similarly to the configuration example of FIG. 3.

The oscillation width of the mask 10 may be set in accordance with the overlap width of the seam portion W. For example, when a piezoelectric element is used as the mask drive unit 12, since the oscillation width of the piezoelectric element is generally 100 μm or smaller, it is preferable to set the oscillation width to be within this range.

Even when the workpiece 7 is irradiated with a laser beam in a positional relationship such that the seam portions of the adjacent rows do not overlap each other when irradiation is performed in a state of not being shielded by the mask 10, if the seam portions W overlap each other due to the diffracted light 2a caused by the mask 10 in the state of being shielded by the mask 10, such an irradiation mode is also possible.

The oscillation frequency of the mask 10 is determined by the pulse frequency of the pulsed laser and a necessary overlap ratio. The relationship between the oscillation frequency of the mask 10 and the overlap ratio at the beam edges are as described above (see FIG. 5).

It is preferable to form the mask 10 using monocrystalline silicon or the like so that the energy intensity at the beam edges does not increase due to the diffracted light 2a at the mask 10 and to regulate the energy intensity while monitoring the energy distribution in the long-axis direction of the beam using a profile monitor.

While preferred embodiments of the present invention have been described and shown above, the disclosed embodiments have been provided for the purpose of illustration but the present invention is not limited to the disclosed embodiments. The scope of the invention is defined as set forth in the appended claims and is intended to encompass all modifications, changes and alterations which fall within the appended claims or the equivalents thereof.

The invention claimed is:

1. A laser annealing method of performing an annealing treatment on a workpiece by irradiating the workpiece with a linear beam having a linear beam spot obtained by shaping laser light into a linear shape while moving the linear beam in a short-axis direction of the linear beam spot relative to the workpiece, wherein the laser annealing method comprises the steps of: (a) concentrating the linear beam of shaped laser light onto a surface of the workpiece by using a condensing lens; (b) performing irradiation of the workpiece with the linear beam with relative movement in the short-axis direction of the linear beam spot on two rows while shifting the linear beam spot in a long-axis direction of the linear beam so that beam irradiation areas of adjacent rows partially overlap each other; (c) controlling an overlap ratio of adjacent two rows by shielding, during irradiation of the linear beam, portions corresponding to edges in the long-axis direction of the linear beam spot concentrated onto the surface of the workpiece using a mask disposed on an optical path of the laser light between the condensing lens and the workpiece, and the mask is operated so as to periodically increase and decrease an amount of shielding; and d) regulating energy intensity at the beam edges so as not to increase the energy intensity due to diffracted light at the mask while monitoring an energy distribution in the long-axis direction of the linear beam using a profile monitor;

wherein the control of the overlap ratio at the beam edges by the mask is performed on a beam edge at a side corresponding to a seam portion when at least one of the adjacent two rows is irradiated; and wherein uniformity of crystallinity in the seam portion is not sacrificed so that the seam portion is not visually recognizable.

2. The laser annealing method according to claim 1, wherein the amount of shielding is periodically increased and decreased by oscillating the mask.

3. The laser annealing method according to claim 2, wherein the mask is oscillated using a piezoelectric element.

4. A laser annealing apparatus that performs an annealing treatment on a workpiece by irradiating the workpiece with a linear beam having a linear beam spot obtained by shaping laser light into a linear shape while moving the linear beam in a short-axis direction of the linear beam spot relative to the workpiece, wherein the laser annealing apparatus comprises:

(a) a condensing lens disposed to concentrate the linear beam of shaped laser light onto a surface of the workpiece;

(b) a device for controlling an overlap ratio of adjacent two irradiated rows by shielding, during the irradiation of the linear beam, portions corresponding to edges in a long axis direction of the linear beam spot while concentrating the linear beam onto a surface of the workpiece, wherein the shielding is provided by a mask disposed in an optical path of the laser light between the condensing lens and the workpiece;

(c) a mask drive unit connected to operate the mask so as to periodically increase and decrease an amount of shielding provided by the mask; and (d) a profile monitor operably connected to regulate energy intensity at the edges of the linear beam so as not to increase energy intensity due to diffracted light at the mask while monitoring an energy distribution in a long-axis direction of the linear beam;

wherein the mask is disposed at only one edge in the long axis direction of the linear beam spot so that control of the overlap ratio is performed on a beam edge at a side corresponding to a seam portion when at least one of the adjacent two rows is irradiated; and wherein uniformity of crystallinity in the seam portion is not sacrificed so that the seam portion is not visually recognizable.

5. The laser annealing apparatus according to claim 4, wherein the mask drive unit periodically increases and decreases the amount of shielding by oscillating the mask.

6. The laser annealing apparatus according to claim 5, wherein the mask drive unit is a piezoelectric element.

7. The laser annealing apparatus according to claim 4, wherein the mask is disposed adjacent to the workpiece to modulate a width of the linear beam spot impinging on the workpiece.

8. A laser annealing method of performing an annealing treatment on a workpiece by irradiating the workpiece with a linear beam having a linear beam spot obtained by shaping laser light into a linear shape while moving the linear beam in a short-axis direction of the linear beam spot relative to the workpiece, wherein the laser annealing method comprises the steps of:
   (a) concentrating the linear beam of shaped laser light onto a surface of the workpiece by using a condensing lens;
   (b) performing irradiation of the workpiece with the linear beam with relative movement in the short-axis direction of the linear beam spot on two rows while shifting the linear beam spot in a long-axis direction of the linear beam so that beam irradiation areas of adjacent rows partially overlap each other;
   (c) controlling an overlap ratio of adjacent two rows by shielding, during irradiation of the linear beam, portions corresponding to edges in the long-axis direction of the linear beam spot concentrated onto the surface of the workpiece using a mask disposed on an optical path of the laser light between the condensing lens and the workpiece, and the mask is operated so as to periodically increase and decrease an amount of shielding; and
   (d) regulating energy intensity at the beam edges so as not to increase the energy intensity due to diffracted light at the mask while monitoring an energy distribution in the long-axis direction of the linear beam using a profile monitor;
   wherein control of the overlap ratio at the beam edges on the side corresponding to a seam portion, is performed when both of the adjacent two rows are irradiated; and
   wherein uniformity of crystallinity in the seam portion is not sacrificed so that the seam portion is not visually recognizable.

9. A laser annealing apparatus that performs an annealing treatment on a workpiece by irradiating the workpiece with a linear beam having a linear beam spot obtained by shaping laser light into a linear shape while moving the linear beam in a short-axis direction of the linear beam spot relative to the workpiece, wherein the laser annealing apparatus comprises:
   (a) a condensing lens disposed to concentrate the linear beam of shaped laser light onto a surface of the workpiece;
   (b) a device for controlling an overlap ratio of adjacent two irradiated rows by shielding, during the irradiation of the linear beam, portions corresponding to edges in a long axis direction of the linear beam spot while concentrating the linear beam onto a surface of the workpiece, wherein the shielding is provided by a mask disposed in an optical path of the laser light between the condensing lens and the workpiece;
   (c) a mask drive unit connected to operate the mask so as to periodically increase and decrease an amount of shielding provided by the mask; and
   (d) a profile monitor operably connected to regulate energy intensity at the edges of the linear beam so as not to increase energy intensity due to diffracted light at the mask while monitoring an energy distribution in a long-axis direction of the linear beam;
   wherein the mask is disposed on both sides in the long axis direction of the linear beam spot so that control of the overlap ratio at the beam edges on a side corresponding to a seam portion is provided when both of the adjacent two rows are irradiated; and
   wherein uniformity of crystallinity in the seam portion is not sacrificed so that the seam portion is not visually recognizable.

* * * * *